US006891451B2

(12) United States Patent
Sawada

(10) Patent No.: US 6,891,451 B2
(45) Date of Patent: May 10, 2005

(54) SURFACE ACOUSTIC WAVE FILTER APPARATUS HAVING DIFFERENT STRUCTURE REFLECTORS

(75) Inventor: Yoichi Sawada, Ishikawa-ken (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 93 days.

(21) Appl. No.: 10/123,452

(22) Filed: Apr. 17, 2002

(65) Prior Publication Data

US 2002/0167378 A1 Nov. 14, 2002

(30) Foreign Application Priority Data

Apr. 18, 2001 (JP) ........................................ 2001-119963

(51) Int. Cl.[7] .............................................. H03H 9/64
(52) U.S. Cl. ..................... 333/195; 333/193; 310/313 R
(58) Field of Search ................. 333/193–196, 333/133; 310/313 R, 313 B, 313 C, 313 D

(56) References Cited

U.S. PATENT DOCUMENTS

| | | | | |
|---|---|---|---|---|
| 5,392,013 A | * | 2/1995 | Yamamoto et al. | 333/195 |
| 5,568,002 A | * | 10/1996 | Kawakatsu et al. | 310/313 B |
| 5,844,453 A | * | 12/1998 | Matsui et al. | 333/193 |
| 5,936,488 A | * | 8/1999 | Taguchi et al. | 333/195 |
| 5,963,114 A | * | 10/1999 | Ueda et al. | 333/195 |
| 6,366,179 B1 | * | 4/2002 | Kuroda | 333/133 |
| 6,483,402 B2 | * | 11/2002 | Endoh et al. | 333/193 |

FOREIGN PATENT DOCUMENTS

| | | |
|---|---|---|
| CN | 479402 | 3/2002 |
| JP | 04-054011 A | 2/1992 |
| JP | 7-131291 | 5/1995 |
| JP | 10-117123 | 5/1998 |
| JP | 10-261935 A | 9/1998 |
| JP | 2001-267885 | 9/2001 |

OTHER PUBLICATIONS

G. Endoh, M. Ueda, O. Kawachi and Y. Fujiwara, "High Performance Balanced Type SAW Filters in the Range of 900MHz and 1.9 GHz"; Proceedings of 1997 IEEE Ultrasonics Symposium, 1997, p. 41–44.

\* cited by examiner

*Primary Examiner*—Minh Nguyen
(74) *Attorney, Agent, or Firm*—Keating & Bennett LLP

(57) ABSTRACT

A surface acoustic wave filter apparatus includes extensional-coupling-resonator-mode first through fourth SAW filter devices which are disposed on a piezoelectric substrate. Each SAW filter device includes three interdigital transducers (IDTs) arranged in a SAW propagating direction, and reflectors arranged such that they sandwich the IDTs therebetween. The SAW filter devices have a balanced-to-unbalanced input/output function. The reflectors of the first and second SAW filter devices are different from those of the third and fourth SAW filter devices in at least one of the number, the pitch, the duty, and the thickness of the electrode fingers of the reflectors.

13 Claims, 8 Drawing Sheets

SURFACE ACOUSTIC WAVE FILTER APPARATUS HAVING DIFFERENT STRUCTURE REFLECTORS

BACKGROUND OF THE INVENTION

1. Field of the Invention

The present invention relates to a surface acoustic wave (SAW) filter apparatus, and more particularly, to a SAW filter apparatus having a balanced-to-unbalanced conversion function and having different impedance characteristics at an input side and an output side of the SAW apparatus. The present invention also relates to a communication apparatus including the above-described SAW filter apparatus.

2. Description of the Related Art

There has been significant technological progress in decreasing the size and the weight of portable communication apparatuses, such as cellular telephones. One way to achieve such results is to reduce the number and the size of the individual components of the communication apparatus. Additionally, components having composite functions are being developed.

In view of this background, research is being actively conducted with respect to a SAW filter apparatus used in an RF stage provided with a balanced-to-unbalanced conversion function (so-called "balun function"). Such SAW filter apparatuses are being mainly used in a global system for mobile communications (GSM).

Generally, in a communication apparatus, an unbalanced signal having a characteristic impedance of 50 Ω is used for a portion from an antenna to a filter. For an amplifier, which is the subsequent stage of the filter, a balanced signal having an impedance of 150 Ω to 200 Ω is usually used.

As a SAW filter apparatus provided with a balun function for converting a 50 Ω unbalanced signal into a 150 Ω to 200 Ω balanced signal, a SAW filter apparatus which implements an unbalanced input and a balanced output by using four SAW filter devices is disclosed in, for example, Japanese Unexamined Patent Application Publication No. 10-117123. The configuration of the SAW filter apparatus disclosed in this publication is shown in FIG. 8.

The SAW filter apparatus shown in FIG. 8 includes two SAW filter units 511 and 512. The SAW filter unit 511 is constructed by cascade-connecting SAW filter devices 501 and 502 having equal phase characteristics, while the SAW filter unit 512 is constructed by cascade-connecting SAW filter devices 503 and 504, having transmission phase characteristics that are about 180° out of phase with each other. The input terminals of the SAW filter units 511 and 512 are connected in parallel to each other by an unbalanced terminal 505, while the output terminals of the SAW filter units 511 and 512 are connected in series to each other by balanced terminals 506 and 507.

In the SAW filter apparatus provided with the above-described balanced-to-unbalanced input/output function, the outputs from the balanced terminals 506 and 507 are used as a difference between the balanced terminals 506 and 507. Accordingly, the maximum output can be obtained when the electrical signals from the balanced terminals 506 and 507 are 180° out of phase with each other. Conversely, when the electrical signals from the balanced terminals 506 and 507 are in phase with each other, they cancel each other out. Accordingly, a higher level of attenuation can be obtained as the two electrical signals have closer levels.

Thus, the SAW filter apparatus is desirably configured so that the outputs of the balanced terminals 506 and 507 are 180° out of phase with each other in the pass band, and they are in phase with each other in the stop band (other than the pass band).

In the SAW filter apparatus disclosed in Japanese Unexamined Patent Application Publication No. 10-117123, four SAW filter devices are used, and for inverting the phase of one of the SAW filter devices, the directions of the comb-like electrodes (interdigital transducers: hereinafter simply referred to as "IDTs") are inverted with respect to the SAW propagating direction as the symmetric axis, or the pitch between the IDTs of one of the SAW filter devices 511 and 512 is increased by 0.5 λ (wavelength).

With this configuration, the phase characteristics of the balanced terminals 506 and 507 are inverted in the pass band, while they are in phase with each other in a frequency band in which a SAW is not excited.

In the above-configured SAW filter apparatus, however, spurious responses are generated in a region in the vicinity of the pass band due to the excitation of a SAW, and the phase characteristics of the balanced terminals 506 and 507 in the region in which spurious responses are generated are disadvantageously inverted with respect to each other, as in the pass band. Thus, signals output from the balanced terminals 506 and 507 do not cancel each other out, and the attenuation in the frequency region other than the pass band is not sufficient.

SUMMARY OF THE INVENTION

In order to overcome the problems described above, preferred embodiments of the present invention provide a SAW filter apparatus provided with a balanced-to-unbalanced input/output function exhibiting high attenuation characteristics even in a region near the pass band, and also provide a communication apparatus including such a SAW filter apparatus.

According to a preferred embodiment of the present invention, a SAW filter apparatus includes a SAW filter device disposed on a piezoelectric substrate. The SAW filter device includes a plurality of IDTs arranged in a SAW propagating direction, and reflectors arranged to reflect the SAW propagating from each of the plurality of IDTs to the corresponding IDT. The SAW device is provided with a balanced-to-unbalanced conversion function. The structure of at least one of the reflectors is different from the structure of the other reflector.

With this configuration, by providing a plurality of IDTs arranged in the SAW propagating direction, a filtering function, which is determined by the conversion between the electrical signal of each IDT and the SAW, can be exhibited in which the electrical signals in the pass band are allowed to pass with a low insertion loss and the electrical signals outside the pass band are minimized. In addition to the filtering function, the SAW filter device is provided with the balanced-to-unbalanced conversion function. The reflectors for reflecting the SAWs propagating from the IDTs to the IDTs are also provided for the SAW filter device, thereby improving the conversion efficiency from the generated SAWs to the electrical signals.

Additionally, the structure of at least one of the reflectors is different from that of the other reflector. Thus, the generation of unwanted spurious responses in a region outside the pass band, and in particular, in a region near the pass band, can be minimized, thereby obtaining a sufficient attenuation level.

According to another preferred embodiment of the present invention, a SAW filter apparatus includes a first SAW filter device disposed on a piezoelectric substrate and including a plurality of IDTs arranged in a SAW propagating direction, and reflectors arranged such that they sandwich the plurality of IDTs therebetween. A second SAW filter device is disposed on the piezoelectric substrate and includes a plurality of IDTs arranged in a SAW propagating direction, and reflectors arranged such that they sandwich the plurality of IDTs therebetween. The transmission phase characteristics of the second SAW filter device are 180° out of phase with the transmission phase characteristics of the first SAW filter device. An unbalanced terminal is used for electrically connecting one terminal of the first SAW filter device in parallel to one terminal of the second SAW filter device. Balanced terminals are used for electrically connecting the other terminal of the first SAW filter device to the other terminal of the second SAW filter device. The structure of the reflectors of the first SAW filter device is different from that of the reflectors of the second SAW filter device.

In the aforementioned SAW filter apparatus, the reflectors of the first SAW filter device may be different from those of the second SAW filter device in at least one of the number, the pitch, the duty, and the thickness of the electrode fingers of the reflectors.

With this configuration, the structure of at least one of the reflectors is different from that of the other reflectors. Thus, the generation of unwanted spurious responses in a region outside the pass and, in particular, in a region near the pass band, can be minimized, thereby easily obtaining a sufficient attenuation level even with one stage of filter devices.

According to still another preferred embodiment of the present invention, a SAW filter apparatus includes first, second, and third SAW filter devices disposed on a piezoelectric substrate. Each of the first, second, and third SAW filter devices includes a plurality of IDTs arranged in a SAW propagating direction, and reflectors arranged such that they sandwich the plurality of IDTs therebetween. A fourth SAW filter device is disposed on the piezoelectric substrate and includes a plurality of IDTs in a SAW propagating direction, and reflectors arranged such that they sandwich the plurality of IDTs therebetween. The transmission phase characteristics of the fourth SAW filter device are 180° out of phase with those of the first, second, and third SAW filter devices. An unbalanced terminal is used for electrically connecting one terminal of a first group obtained by cascade-connecting the first and second SAW filter devices in parallel to one terminal of a second group obtained by cascade-connecting the third and fourth SAW filter devices. Balanced terminals are used for electrically connecting the other terminal of the first group in series to the other terminal of the second group. The structure of the reflectors of at least one of the first through fourth SAW filter devices is different from that of the reflectors of the other SAW filter devices.

With this configuration, by providing a plurality of stages of filter devices, a balanced-to-unbalanced input/output function having different input/output impedances can be achieved. By differentiating the structures of the reflectors, the generation of unwanted spurious responses in a region outside the pass band, in particular, in a region near the pass band, can be minimized, and the attenuation level can be further improved over that obtained by a SAW filter apparatus having a first stage of filter devices.

In the aforementioned SAW filter apparatus, the structure of the reflectors of the first group may be different from that of the reflectors of the second group. With this arrangement, the generation of unwanted spurious responses in a region outside the pass band, in particular, in a region near the pass band, can be reliably minimized.

In the aforementioned SAW filter apparatus, the structures of the reflectors may be different among the first through fourth SAW filter devices in at least one of the number, the pitch, the duty, and the thickness of electrode fingers of the reflectors.

According to a further preferred embodiment of the present invention, a communication apparatus includes one of the above-described SAW filter apparatuses.

By using the SAW filter apparatus having a low insertion loss in the pass band and a high attenuation level in a region outside the pass band, in particular, in a region lower than the pass band, and exhibiting excellent transmission characteristics, the communication apparatus exhibits excellent communication characteristics.

Other features, elements, characteristics and advantages of the present invention will become more apparent from the following detailed description of preferred embodiments with reference to the attached drawings.

DETAILED DESCRIPTION OF PREFERRED EMBODIMENTS

The present invention is described in detail below with reference to FIGS. 1 through 7 through illustration of preferred embodiments.

Figure 1:
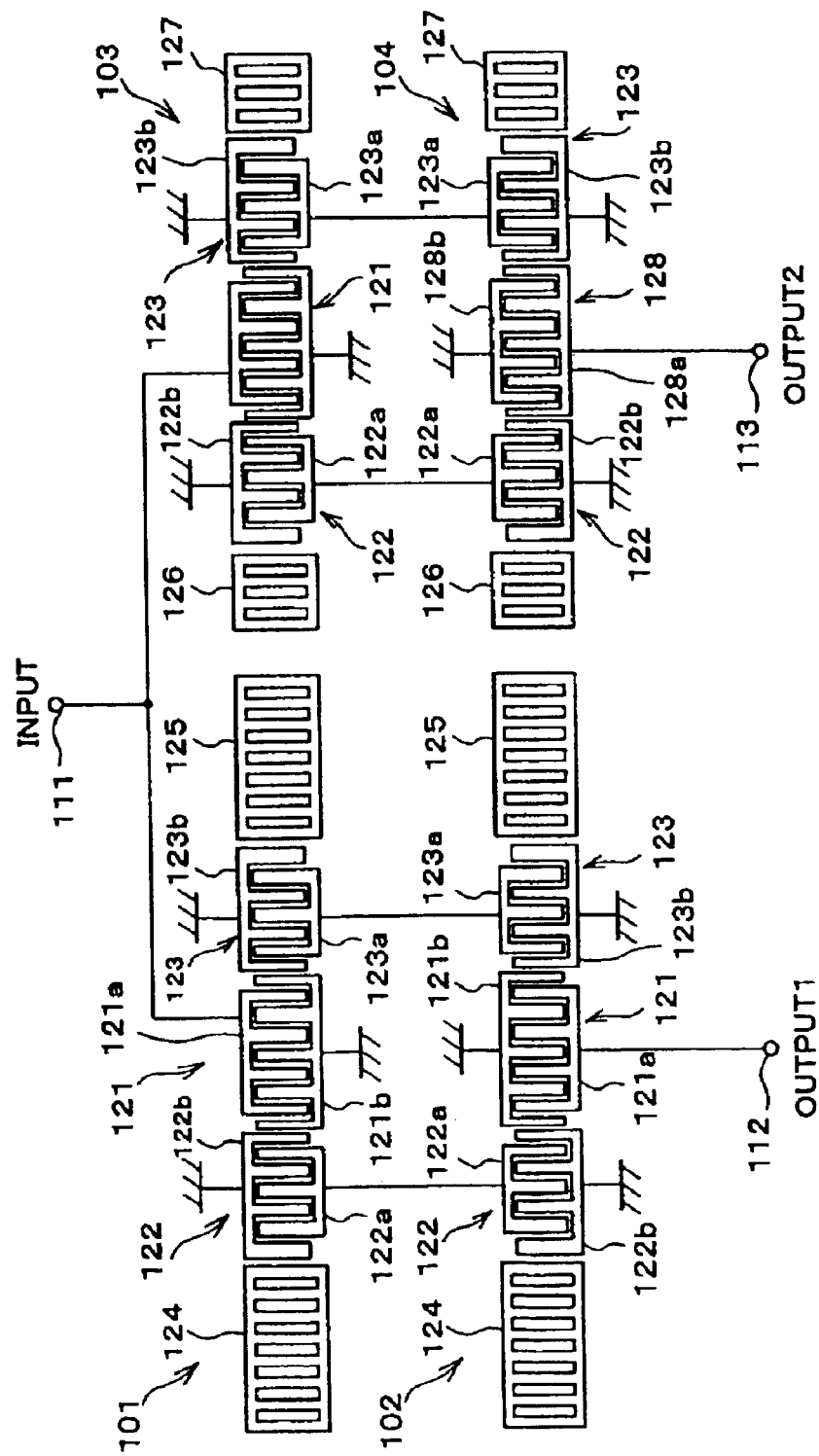
FIG. 1 is a schematic diagram illustrating a SAW filter apparatus according to a first preferred embodiment of the present invention.

In a SAW filter apparatus constructed in accordance with a first preferred embodiment of the present invention, as shown in FIG. 1, first through fourth SAW filter devices 101 through 104 are disposed on a piezoelectric substrate. The transmission phase characteristics of the fourth SAW filter device 104 are substantially 180° out of phase with those of the third SAW filter device 103. The piezoelectric substrate is not shown in FIG. 1.

The first SAW filter device 101 preferably has three IDTs 123, 121, and 122. The IDTs each have a strip-like base portion (bus bar) and two electrode portions provided with a plurality of strip-like electrode fingers. The electrode fingers extend substantially perpendicularly from one side of the base portion such that they are substantially parallel to each other. The electrode fingers also interdigitate with each other such that the sides thereof face each other.

In the above-configured IDTs, the signal conversion characteristics and the pass band (in other words, the bands other than the pass band) can be determined by setting the length and the width of each electrode finger, the pitch between adjacent electrode fingers, and the length by which interdigitated electrode fingers face each other (hereinafter referred to as the "interdigital length").

The IDTs 123, 121, and 122 are disposed on the piezoelectric substrate so that the electrode fingers extend substantially perpendicularly to the SAW propagating direction, and also the IDTs 123, 121, and 122 are arranged in this order in accordance with the SAW propagating direction. The central IDT 121 includes a signal electrode finger 121a connected to an unbalanced terminal 111 and a ground electrode finger 121b. The IDT 122 includes a signal electrode finger 122a and a ground electrode finger 122b. The IDT 123 includes a signal electrode finger 123a and a ground electrode finger 123b.

In the first SAW filter device 101, reflectors 124 and 125 are arranged along the SAW propagating direction such that they sandwich the IDTs 123, 121, and 122 therebetween. The reflectors 124 and 125 have the function of reflecting a propagating SAW thereon and reflecting back the SAW to the original position.

Accordingly, the reflector 124 is disposed in the SAW propagating direction opposite to the IDT 121 across the IDT 122, while the reflector 125 is disposed in the SAW propagating direction opposite to the IDT 121 across the IDT 123.

Each of the reflectors 124 and 125 includes a pair of strip-like base portions (bus bars) and a plurality of electrode fingers extending from one side of each of the base portions on the piezoelectric substrate. The electrode fingers extend substantially parallel with each other and extending in the direction that is substantially perpendicular to the longitudinal direction of the base portions so as to interconnect the two base portions.

With this configuration, the reflectors 124 and 125 are excited by the propagating SAW, and a SAW generated by the excitation electrical signal cancels the propagating SAW. The reflectors 124 and 125 also generate a SAW in the opposite direction to the SAW propagating direction. That is, the reflectors 124 and 125 reflect the propagating SAW in a pseudo manner.

The second SAW filter device 102 has substantially the same amplitude characteristics and the phase characteristics as those of the first SAW filter device 101.

The second SAW filter device 102 is arranged so that the SAW propagating direction thereof is substantially parallel to that of the first SAW filter device 101, and such that the second SAW filter device 102 is symmetrical to the first SAW filter device 101 with respect to the above-described SAW propagating direction.

With this arrangement, the first SAW filter device 101 and the second SAW filter device 102 can be positioned in close proximity with each other, and the connection thereof can be simplified, thereby decreasing the size of the filters.

In the above-configured second SAW filter device 102, signal electrode fingers 122a and 123a are connected to the signal electrode fingers 122a and 123a, respectively, of the first SAW filter device 101, and thus, the first and second SAW filters 101 and 102 can be cascade-connected. A signal electrode finger 121a of the central IDT 121 of the second SAW filter device 102 is connected to one balanced terminal 112.

The configuration of the third SAW filter device 103 is similar to that of the first SAW filter device 101, except that reflectors 126 and 127 which are configured differently from the reflectors 124 and 125 are used (for example, the number of electrode fingers are different).

It is preferable that the third SAW filter device 103 is arranged along the SAW propagation path of the first SAW filter device 101 and connected in series to the SAW propagating direction of the first SAW filter device 101. In the first SAW filer device 101, the reflectors 124 and 125 are disposed such that they sandwich the IDTs 122, 121, and 123 therebetween, and in the third SAW filter device 103, the reflectors 126 and 127 are disposed such that they sandwich the IDTs 122, 121, and 123 therebetween. Accordingly, the interference of the SAWs between the first and third SAW filter devices 101 and 103 can be prevented.

With this arrangement, the third SAW filter device 103 can be disposed in series to the first SAW filter device 101, and the size of the resulting SAW apparatus can be reduced compared to a SAW apparatus in which SAW filter devices are disposed outside the SAW propagation path.

The configuration of the fourth SAW filter device 104 is similar to that of the third SAW filter device 103, except that a central IDT 128 which is 180° out of phase with the central IDT 121 of the third SAW filter device 103 is used.

Signal electrode fingers 122a and 123a of the fourth SAW filter device 104 are respectively connected to the signal electrode fingers 122a and 123a of the third SAW filter device 103. A signal electrode finger 128a of the IDT 128 of the fourth SAW filter device 104 is connected to the other balanced terminal 113.

The fourth SAW filter device 104 is disposed in close proximity with the third SAW filter device 103 so that the SAW propagation directions become substantially in parallel with each other. The SAW propagating direction of the fourth SAW filter device 104 may be on the SAW propagation path of the second SAW filter device 102. With this configuration, the size of the resulting SAW filter apparatus can be further reduced.

Examples of the specific configurations of the first through fourth SAW filter devices 101 through 104 are as follows:

The configuration of the first SAW filter device 101 is:
 interdigital length W: about 125 μm;
 number of pairs of electrode fingers of second IDT: 15;
 number of pairs of electrode fingers of first IDT: 20;
 number of pairs of electrode fingers of third IDT: 15;
 IDT pitch PI: about 2.25 μm;
 duty (electrode coverage) L/P: about 0.70;
 number of electrode fingers of reflector NR: 90;
 reflector pitch PR: about 2.30 μm; and
 thickness of reflector: about 370 nm.

The configuration of the second SAW filter device 102 is:
 interdigital length W: about 125 μm;
 number of pairs of electrode fingers of second IDT: 15;
 number of pairs of electrode fingers of first IDT: 20;
 number of pairs of electrode fingers of third IDT: 15;
 IDT pitch PI: about 2.25 μm;
 duty (electrode coverage) L/P: about 0.70;
 number of electrode fingers of reflector NR: 90;
 reflector pitch PR: about 2.30 μm; and
 thickness of reflector: about 370 nm.

The configuration of the third SAW filter device 103 is:
 interdigital length W: about 125 μm;
 number of pairs of electrode fingers of second IDT: 15;
 number of pairs of electrode fingers of first IDT: 20;
 number of pairs of electrode fingers of third IDT: 15;
 IDT pitch PI: about 2.25 μm;

duty (electrode coverage) L/P: about 0.70;
number of electrode fingers of reflector NR: 73;
reflector pitch PR: about 2.30 μm; and
thickness of reflector: about 370 nm.

The configuration of the fourth SAW filter device 104 is:
interdigital length W: about 125 μm;
number of pairs of electrode fingers of second IDT: 15;
number of pairs of electrode fingers of first IDT: 20;
number of pairs of electrode fingers of third IDT: 15;
IDT pitch PI: about 2.25 μm;
duty (electrode coverage) L/P: about 0.70;
number of electrode fingers of reflector NR: 73;
reflector pitch PR: about 2.30 μm; and
thickness of reflector: about 370 nm.

The above-described first through fourth SAW filter devices 101 through 104 are disposed on, for example, a LiTaO$_3$ piezoelectric substrate. However, the piezoelectric substrate is not restricted to the above type. In the above-described specific configurations of the SAW filter devices, the first IDT indicates the central IDT, for example, the IDT 121, and the second and third IDTs are IDTs disposed across the central IDT, for example, the IDTs 122 and 123.

The central IDT 128 of the fourth SAW filter device 104 is inverted relative to the central IDTs 121 of the first through third SAW filter devices 101 through 103. Accordingly, the transmission phase characteristics of the fourth SAW filter device 104 are about 180° out of phase with those of the first through third SAW filter devices 101 through 103.

A first SAW filter group including the first and second SAW filter devices 101 and 102 is different from a second SAW filter group including of the third and fourth SAW filter devices 103 and 104 in the structures of the reflectors. For example, the number of electrode fingers of the reflectors 124 and 125 are different from those of the reflectors 126 and 127. Other characteristics of the reflectors 124 and 125 may be different from those of the reflectors 126 and 127.

Only a few pairs of electrode fingers of each IDT and a few electrode fingers of each reflector are shown in FIG. 1 since all of the electrode fingers cannot be shown.

Figure 2:
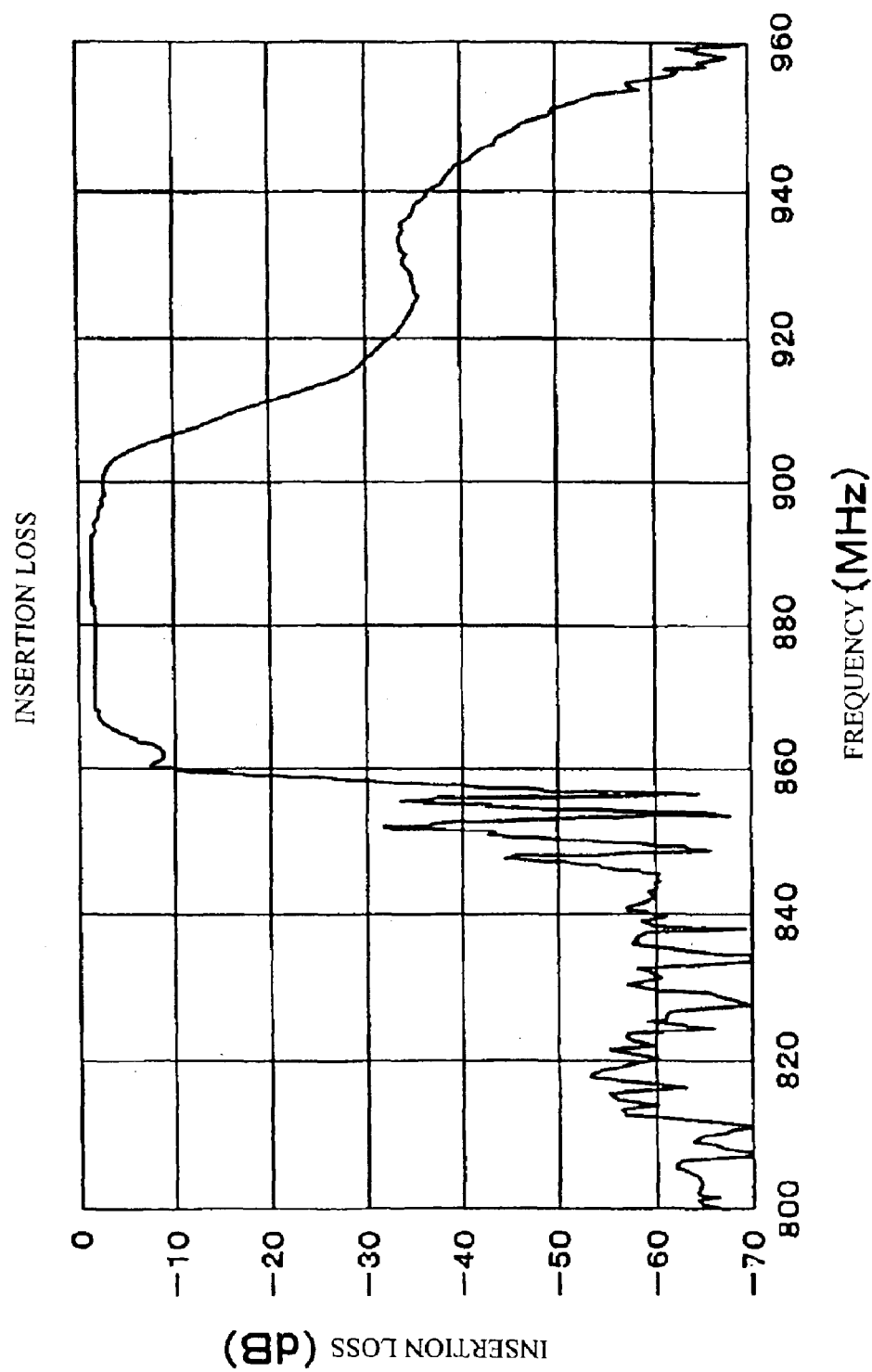
FIG. 2 is a diagram illustrating the transmission characteristics with respect to the frequency in the SAW filter apparatus shown in FIG. 1.
Figure 3:
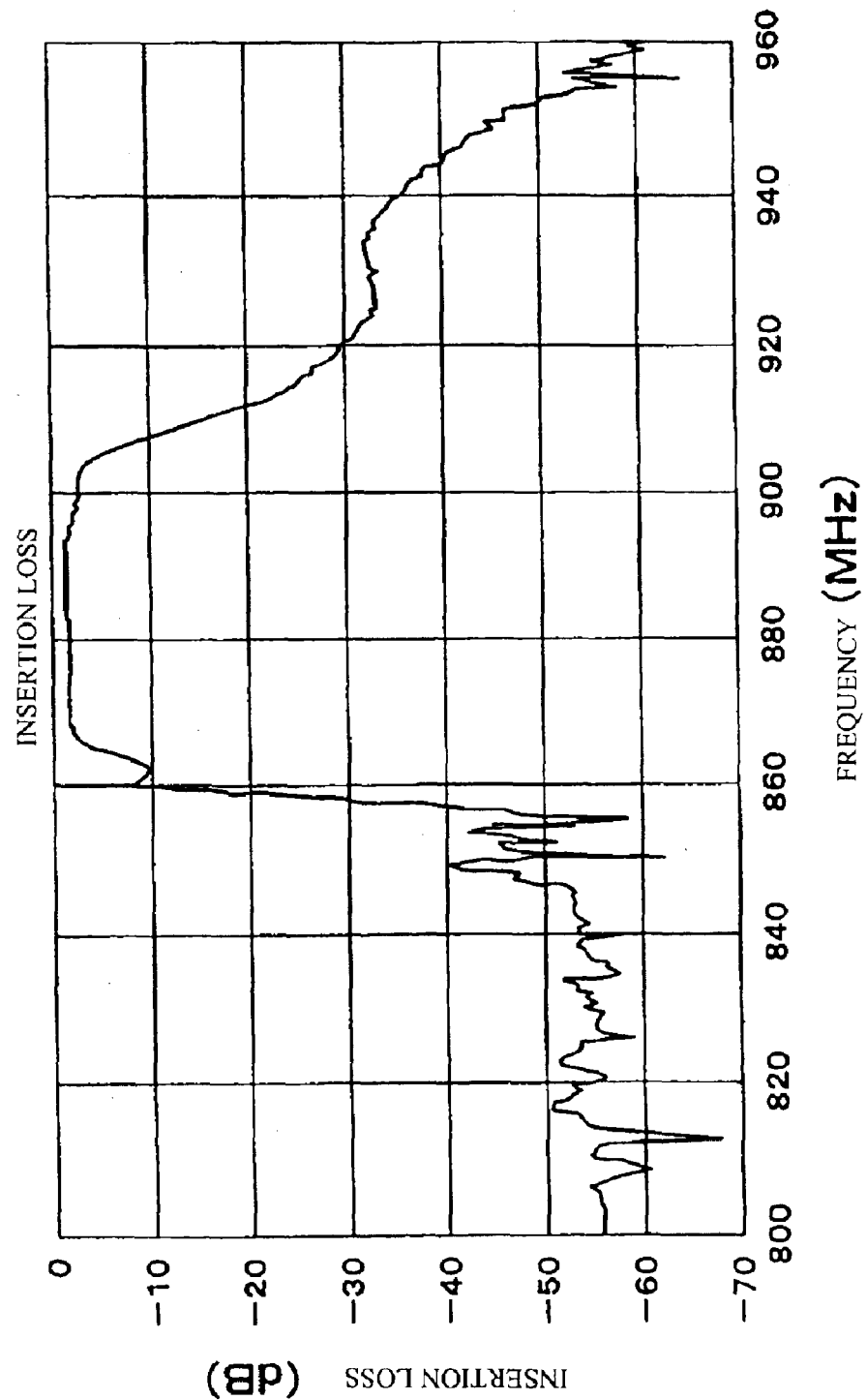
FIG. 3 is a diagram illustrating the transmission characteristics with respect to the frequency in a known SAW filter apparatus.

The characteristics of the SAW filter apparatus of the first preferred embodiment are shown in FIG. 2. In the first preferred embodiment, the characteristics, in particular, the attenuation at the range lower than the pass band, are improved over that of a known SAW apparatus having the characteristics shown in FIG. 3.

In the first preferred embodiment, substantially equal transmission characteristics within the stop bands of the reflectors 124 and 125 are obtained among the first through third SAW filter devices 101 through 103.

In the fourth SAW filter device 104, transmission characteristics within the stop bands of the reflectors 126 and 127 are obtained such that phase characteristics are substantially 180° out of phase with those of the first through third SAW filter devices 101 through 103 and that amplitude characteristics are substantially the same as those of the first through third SAW filter devices 101 through 103.

By connecting the above-described first through fourth SAW filter devices 101, 102, 103, and 104 as described in the first preferred embodiment, signals having phase characteristics that are 180° out of phase with each other are input into the output balanced terminals 112 and 113. It is thus possible to provide a SAW filter apparatus having an unbalanced input terminal (having an impedance of, for example, about 50 Ω) and balanced output terminals (having an impedance of, for example, about 200 Ω).

In the fourth SAW filter device 104, by inverting the direction of the IDT 128 which excites a SAW relative to that of the IDTs 121 of the first through third SAW filter devices 101, 102, and 103 with respect to the SAW propagating direction as the symmetric axis, the transmission phase characteristics of the fourth SAW filter device 104 are changed. Thus, in a region in which a SAW is not excited, the transmission characteristics of the fourth SAW filter device 104 are substantially the same as those of the first through third SAW filter devices 101 through 103. As a result, in-phase electrical signals output from the balanced terminals 112 and 113 cancel each other out, thereby obtaining a high level of attenuation.

Even outside the stop bands of the reflectors, there is a frequency range near the pass band in which a SAW is excited. The transmission characteristics of this frequency range are determined by the number, the duty (electrode coverage), the pitch, and the thickness of the electrode fingers of the reflectors. Accordingly, if the structures of the reflectors are the same among the first through fourth SAW filter devices 101 through 104, the signals obtained at the output terminals are out of phase with each other, as in the pass band. Thus, a sufficient level of attenuation cannot be obtained.

According to the first preferred embodiment, however, the number of electrode fingers of the reflectors is differentiated between the reflectors 124 and 125 of the first and second SAW filter devices 101 and 102 and the reflectors 126 and 127 of the third and fourth SAW filter devices 103 and 104. Thus, in the region other than the stop bands of the reflectors, in particular, in the frequency range lower than the pass band, the phase characteristics of the electrical signal are changed.

With this configuration, the electrical signals at the balanced terminals are in phase with each other even in a frequency range near the pass band, thereby achieving a sufficient level of attenuation by utilizing the cancellation effect of the signals. Instead of differentiating the number of electrode fingers of the reflectors between the SAW filter devices, the duty (electrode coverage), the pitch, or the thickness of the reflectors can be changed between the SAW filter devices, in which case, advantages similar to those of the first preferred embodiment can be obtained.

As one way of improving the attenuation by differentiating the structure of the reflectors, Japanese Unexamined Patent Application Publication No. 7-131291 discloses cascade-connected SAW filter devices in which the pitch or the number of electrode fingers of the reflectors is changed between the first and second stages of the filters.

In the above publication, the attenuation level is increased in view of the amplitude characteristics by changing the spurious frequency between the first and second stages. According to preferred embodiments of the present invention, however, by utilizing the characteristics of a balanced filter in which electrical signals having substantially equal amplitude characteristics and a phase difference of 180° at the balanced terminals cancel each other out, the attenuation level is greatly improved. Thus, the principle of the present invention is totally different from that of the above publication.

Figure 4:
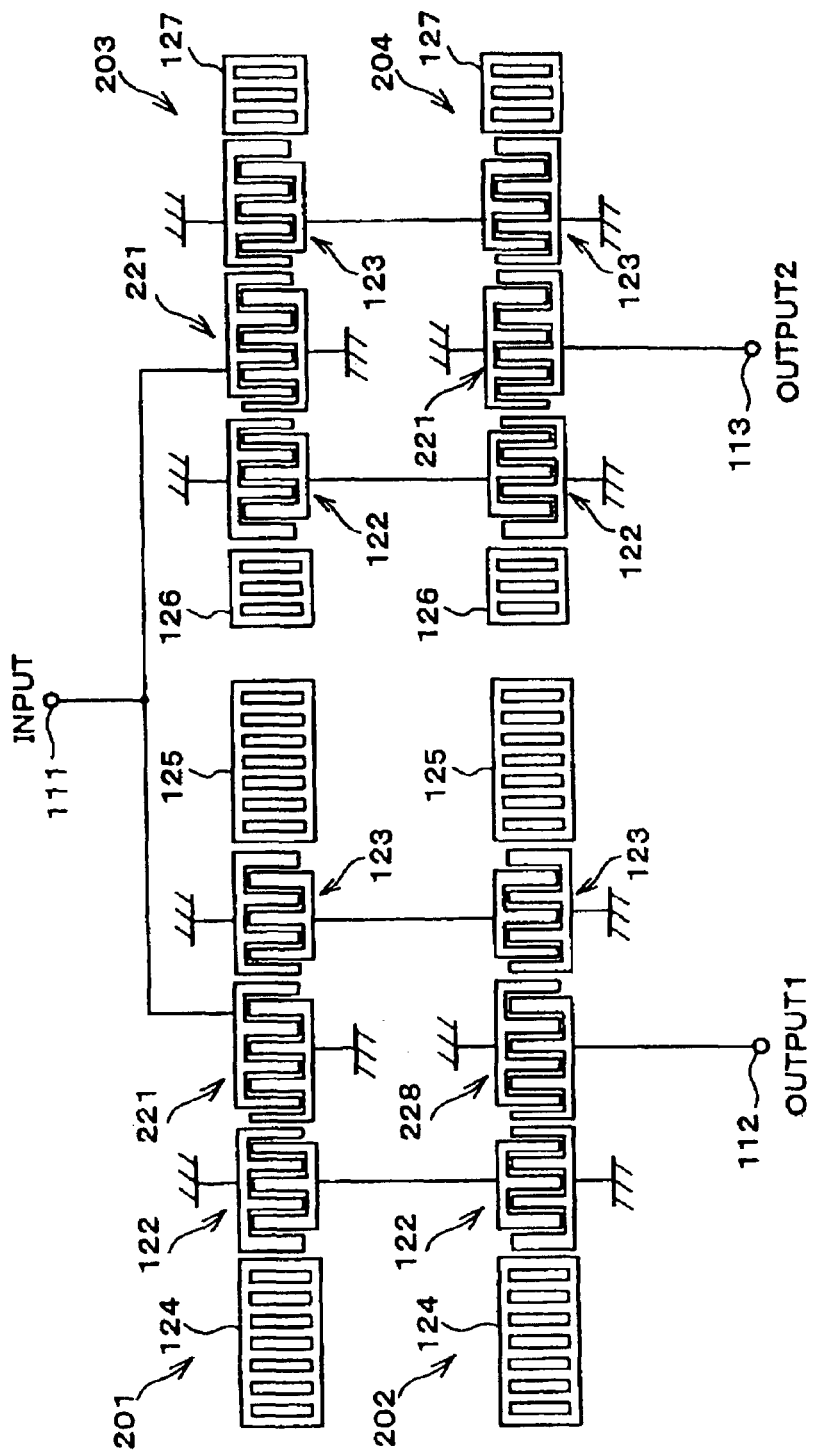
FIG. 4 is a schematic diagram illustrating a SAW filter apparatus according to a second preferred embodiment of the present invention.

A SAW filter apparatus constructed in accordance with a second preferred embodiment of the present invention is described below with reference to FIG. 4. In the second preferred embodiment, elements having functions similar to those of the first preferred embodiment are designated with like reference numerals, and an explanation thereof is thus omitted.

The SAW filter apparatus of the second preferred embodiment includes first through fourth SAW filter devices 201 through 204 disposed on a piezoelectric substrate. In this SAW filter apparatus, a central IDT 228 of the second SAW filter device 202 is inverted relative to central IDTs 221 of the first, third, and fourth SAW filter devices 201, 203, and 204. In FIG. 4, the piezoelectric substrate is not shown.

In the second preferred embodiment, the number of electrode fingers of the central IDTs of the first through fourth SAW filter devices 201 through 204 is preferably an even number. With this configuration, as in the configuration of the first preferred embodiment, the output terminals 112 and 113 function as balanced terminals. The structure of the reflectors 124 and 125 of the first and second SAW filter devices 201 and 202 is different from that of the reflectors 126 and 127 of the third and fourth SAW filter devices 203 and 204. For example, the number of electrode fingers of the reflectors is different between the first and second SAW filter devices 201 and 202 and the third and fourth SAW filter devices 203 and 204. With this configuration, the phase characteristics in the frequency range other than the pass band can be changed between the first and second SAW filters 201 and 202 and the third and fourth SAW filters 203 and 204. It is thus possible to obtain a sufficient level of attenuation by utilizing the cancellation of electrical signals at the balanced terminals 112 and 113.

Figure 5:
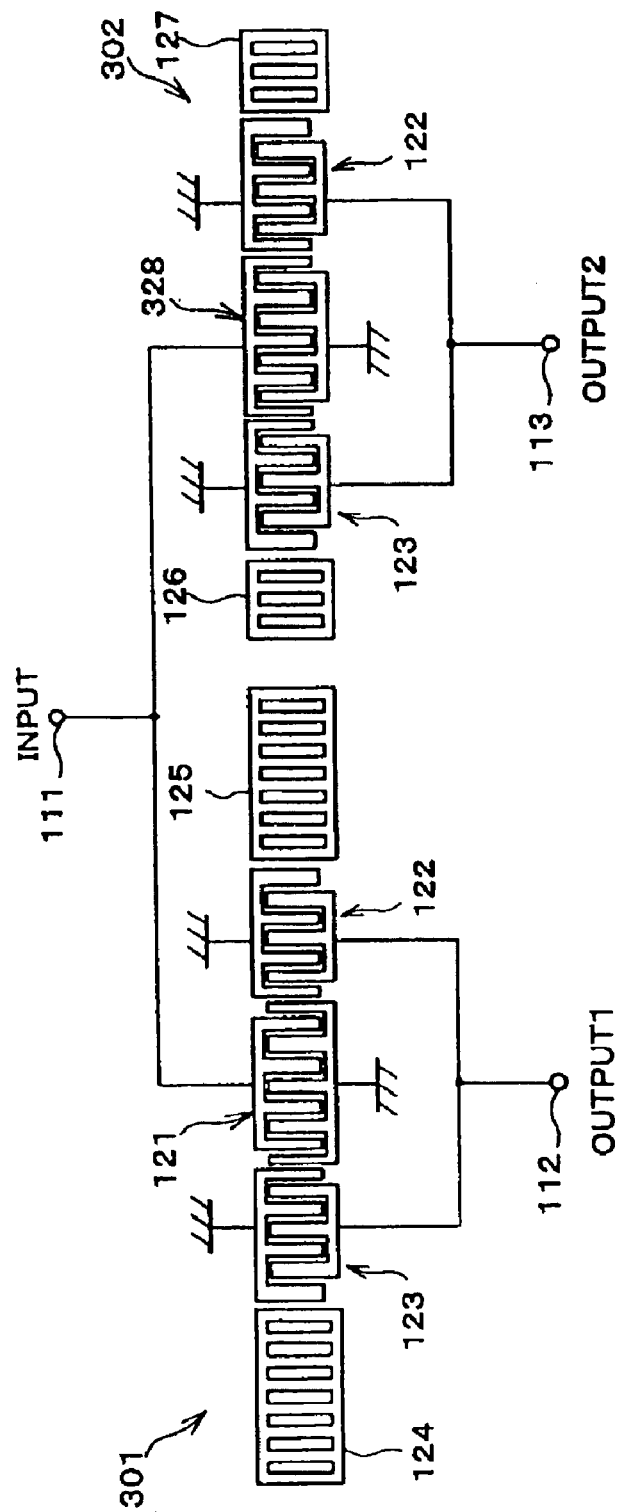
FIG. 5 is a schematic diagram illustrating a SAW filter apparatus according to a third preferred embodiment of the present invention.

A description is now given of a SAW filter apparatus constructed in accordance with a third preferred embodiment of the present invention with reference to FIG. 5. The SAW filter apparatus of the third preferred embodiment includes first and second SAW filter devices 301 and 302 on a piezoelectric substrate.

The transmission phase characteristics of the second SAW filter device 302 are substantially 180° out of phase with those of the first SAW filter device 301. This is because a central IDT 328 of the second SAW filter device 302 is inverted relative to the central IDT 121 of the first SAW filter device 301.

The piezoelectric substrate is not shown in FIG. 5. The components having functions similar to those of the first preferred embodiment are indicated by like reference numerals, and an explanation thereof is thus omitted.

The configuration of the first SAW filter device 301 is:
  interdigital length W: about 115 $\mu$m;
  number of pairs of electrode fingers of second IDT: 12;
  number of pairs of electrode fingers of first IDT: 17;
  number of pairs of electrode fingers of third IDT: 12;
  IDT pitch PI: about 2.10 $\mu$m;
  duty (electrode coverage) L/P: about 0.72;
  number of electrode fingers of reflector NR: 90;
  reflector pitch PR: about 2.15 $\mu$m; and
  thickness of reflector: about 345 nm.

The configuration of the second SAW filter device 302 is:
  interdigital length W: about 115 $\mu$m;
  number of pairs of electrode fingers of second IDT: 12;
  number of pairs of electrode fingers of first IDT: 17;
  number of pairs of electrode fingers of third IDT: 12;
  IDT pitch PI: about 2.10 $\mu$m;
  duty (electrode coverage) L/P: about 0.70;
  number of electrode fingers of reflector NR: 73;
  reflector pitch PR: about 2.15 $\mu$m; and
  thickness of reflector: about 345 nm.

A LiTaO$_3$ substrate is preferably used as the piezoelectric substrate.

According to the third preferred embodiment, the transmission characteristics having a phase difference of 180° and substantially equal amplitude characteristics in the stop bands of the reflectors between the first and second SAW filter devices 301 and 302 are obtained.

By connecting the first and second SAW filter devices 301 and 302 as in the third preferred embodiment, it is possible to obtain a SAW filter apparatus in which the input terminal function as an unbalanced terminal, and the output terminals function as balanced terminals.

There is a frequency range near the pass band and outside the stop bands of the reflectors in which a SAW is excited. The transmission characteristics of this frequency range are determined by the number, the duty (electrode coverage), the pitch, and thickness of electrode fingers of the reflectors.

Accordingly, if the structures of the reflectors are equal between the first and second SAW filter devices 301 and 302, the phase characteristics of the electrical signals at the balanced terminals are inverted, as in the pass band, thereby failing to obtain a sufficient level of attenuation.

In the third preferred embodiment, by differentiating the number of electrode fingers of the reflector between the first and second SAW filter devices 301 and 302, the phase characteristics of the electrical signal in a frequency range other than the stop bands, in particular, in a range lower than the pass band, are changed. Thus, the electrical signals at the balanced terminals cancel each other out, thereby achieving a sufficient level of attenuation even in the region in the vicinity of the pass band.

A SAW filter apparatus constructed in accordance with a fourth preferred embodiment of the present invention is discussed below with reference to FIG. 6. In the fourth preferred embodiment, first and second SAW filter devices 401 and 402 are similar to the first and second SAW filter devices 301 and 302 of the third preferred embodiment. In the fourth preferred embodiment, a SAW resonator 403 is connected to each of the input terminals and the output terminals of the first and second SAW filter devices 401 and 402. The configuration of the SAW resonators 403 is:
  interdigital length W: about 80 $\mu$m;
  number of pairs of electrode fingers of IDT: 90;
  IDT pitch PI: about 2.10 $\mu$m;
  duty (electrode coverage) L/P: about 0.65;
  number of electrode fingers of reflector NR: 30; and
  reflector pitch PR: about 2.10 $\mu$m.

A LiTaO$_3$ substrate is preferably used as the piezoelectric substrate.

Figure 6:
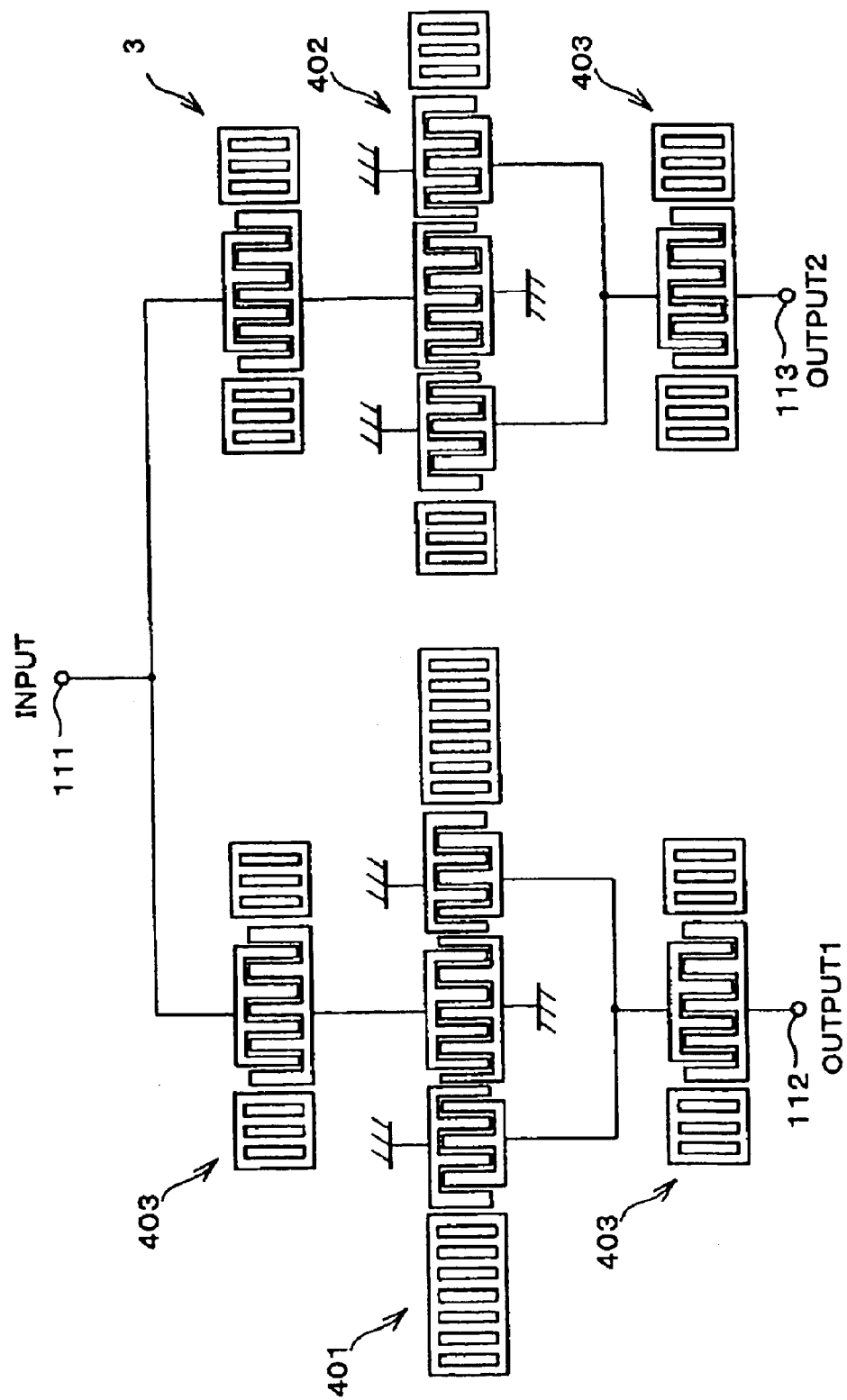
FIG. 6 is a schematic diagram illustrating a SAW filter apparatus according to a fourth preferred embodiment of the present invention.

In the SAW filter apparatus of the fourth preferred embodiment, by connecting the SAW resonators 430 to the first and second SAW filter devices 401 and 402 (301 and 302) as shown in FIG. 6, the attenuation in a region other than the pass band can be improved.

In the fourth preferred embodiment, the SAW filter apparatus is obtained by adding the SAW resonators 403 to the third preferred embodiment. As in the third preferred embodiment, the phase characteristics of the electrical signal in a region other than the stop bands, in particular, in a range lower than the pass band, are changed, and the cancellation effect of the electrical signals at the balanced terminals is greatly improved, thereby obtaining a high level of attenuation.

Additionally, in the fourth preferred embodiment, the SAW resonators 403 have a resonance point in the pass band, and have an antiresonance point in the region other than the pass band, thereby effectively improving the attenuation in a specific frequency range without increasing the in-band loss.

Although in the foregoing preferred embodiments a plurality of SAW filter devices are used, only a single SAW filter device, for example, the fourth SAW filter device 104 may be used. In this case, as in the foregoing preferred embodiment, a balanced-to-unbalanced conversion function is provided, and the structures of the reflectors are differentiated as discussed above. Then, the spurious level can be minimized.

Additionally, for inverting the phase of at least one of the SAW filter devices to the phases of the other SAW filter devices, the direction of one central IDT is inverted. However, the pitch between certain IDTs may be changed from the pitches of the other IDTs by about 0.5 λ (wavelength) so that the corresponding SAW filter device may be set 180° out of phase with respect to the other SAW filter devices.

In the aforementioned preferred embodiments, the input terminal is preferably used as the unbalanced terminal, and the output terminals are used as the balanced terminals. However, the input terminals may function as the balanced terminals, and the output terminal may function as the unbalanced terminal.

Figure 7:
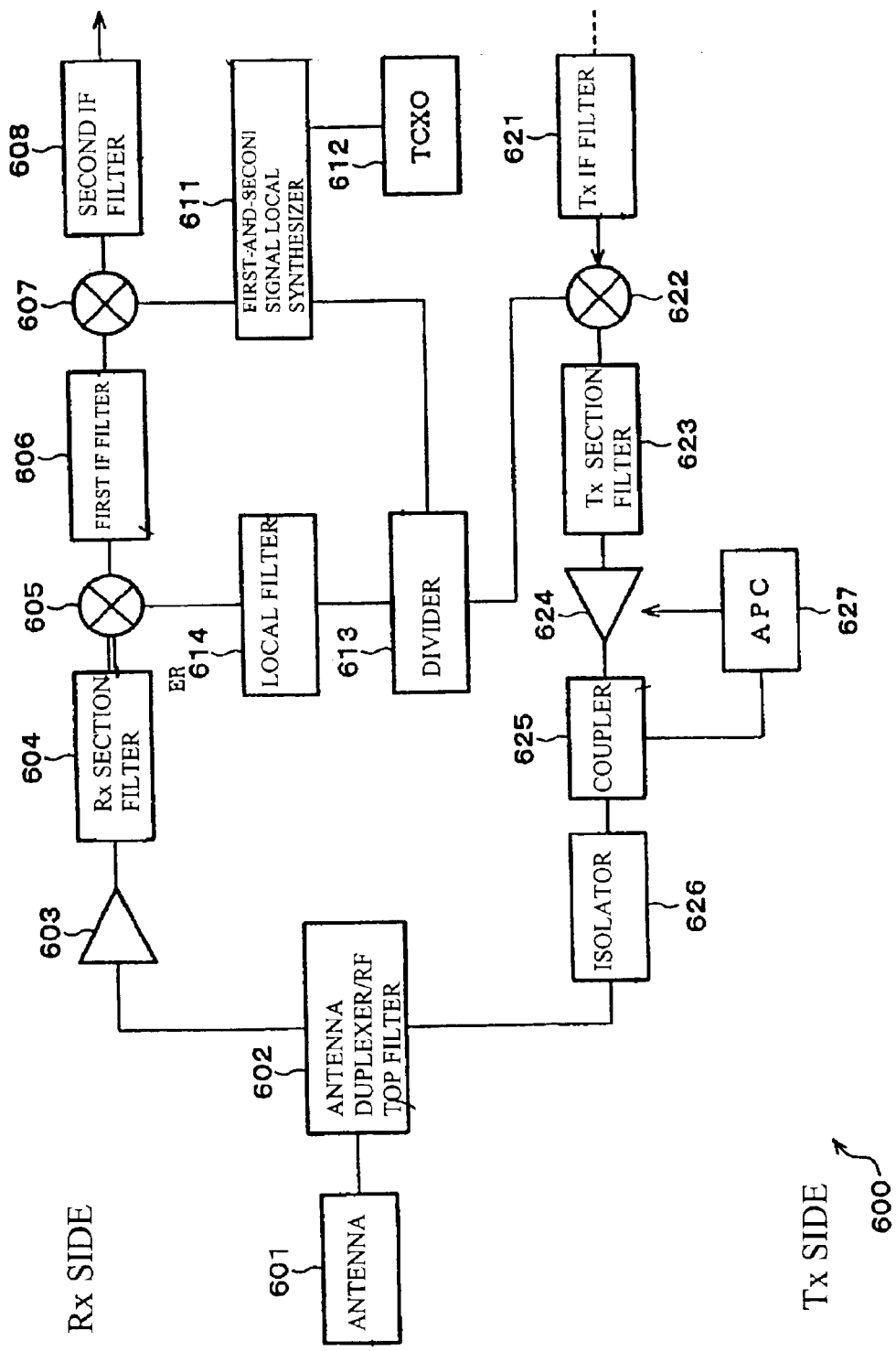
FIG. 7 is a block diagram schematically illustrating a communication apparatus according to a fifth preferred embodiment of the present invention.
Figure 8:
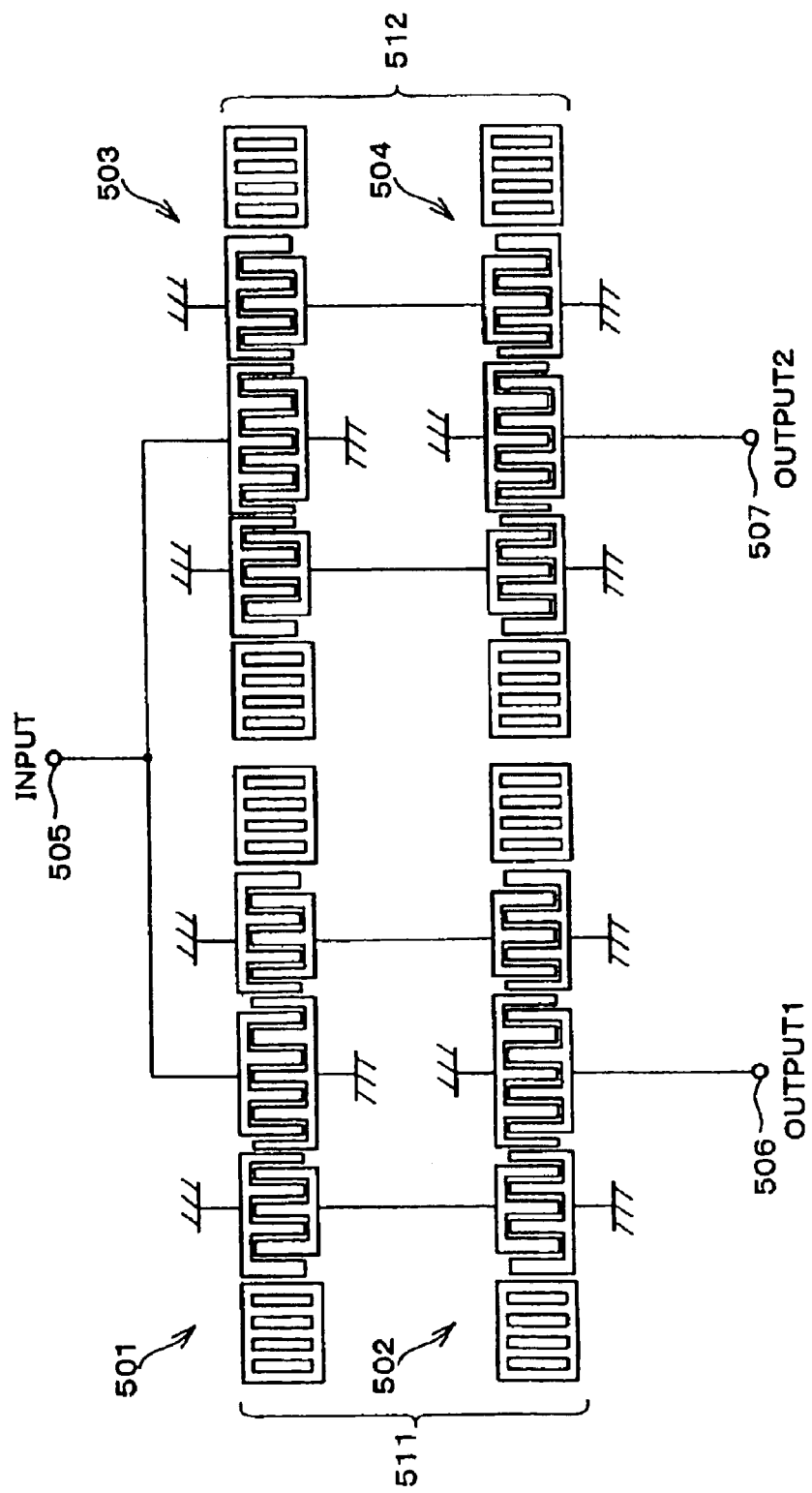
FIG. 8 is a schematic diagram illustrating a known SAW filter apparatus.

A description is now given, with reference to FIG. 7, a communication apparatus including at least one of the SAW filter apparatus of one of the first through fourth preferred embodiments according to a fifth preferred embodiment of the present invention.

In a communication apparatus 600, as shown in FIG. 7, a receiver (Rx) includes an antenna 601, an antenna duplexer/RF top filter 602, an amplifier 603, an Rx section filter 604, a mixer 605, a first IF filter 606, a mixer 607, a second IF filter 608, a first-and-second-signal local synthesizer 611, a temperature compensated crystal oscillator (TCXO) 612, a divider 613, and a local filter 614.

As indicated by two lines between the Rx section filter 604 and the mixer 605 shown in FIG. 7, two balanced signals are preferably transmitted from the Rx section filter 604 to the mixer 605 in order to maintain the balance characteristics.

In the communication apparatus 600, a transmitter (Tx) includes the antenna 601, the antenna duplexer/RF top filter 602, a Tx IF filter 621, a mixer 622, a Tx section filter 623, an amplifier 624, a coupler 625, an isolator 626, and an automatic power control (APC) device 627. The antenna 601 and the antenna duplexer/RF top filter 602 are shared by the receiver (Rx) and the transmitter (Tx).

The SAW filter apparatus of one of the first through fourth preferred embodiments is suitably used as the Rx section filter 604, the first IF filter 606, the Tx IF filter 621, and the Tx section filter 623.

The SAW filter apparatus of preferred embodiments of the present invention is provided with not only a filtering function, but also a balanced-to-unbalanced conversion function, and also exhibits a high level of attenuation in a region other than the pass band, in particular, in a range lower than the pass band. Thus, according to the communication apparatus including the above-described SAW filter apparatus having a composite function, the number of components of the communication apparatus can be reduced, and accordingly, the size of the overall communication apparatus can be decreased. The transmission characteristics (communication characteristics) can also be greatly improved.

While preferred embodiments of the invention have been described above, it is to be understood that variations and modifications will be apparent to those skilled in the art without departing the scope and spirit of the invention. The scope of the invention, therefore, is to be determined solely by the following claims.

What is claimed is:

1. A surface acoustic wave filter apparatus comprising:
a piezoelectric substrate;
a surface acoustic wave unit disposed on said piezoelectric substrate, said surface acoustic wave unit provided with a balanced-to-unbalanced conversion function, the surface acoustic wave unit including a plurality of surface acoustic wave filter devices, each of the plurality of surface acoustic wave devices including:
a plurality of interdigital transducers arranged in a direction in which a surface acoustic wave propagates; and
a set of two reflectors disposed at opposite ends of the plurality of interdigital transducers; wherein
the structure of a first set of two reflectors is different from the structure of a second set of two reflectors; and
at least one of the number, the pitch, the duty, and the thickness of electrode fingers of the first and second sets of two reflectors is different from each other.

2. A surface acoustic wave filter apparatus according to claim 1, wherein each set of two reflectors of each of the plurality of interdigital transducers is different from the sets of two reflectors of the others of the plurality of interdigital transducers.

3. A surface acoustic wave filter apparatus according to claim 1, wherein the piezoelectric substrate is a LiTaO₃ piezoelectric substrate.

4. A communication apparatus comprising the surface acoustic wave filter apparatus according to claim 1.

5. A surface acoustic wave filter apparatus comprising:
a piezoelectric substrate;
a first surface acoustic wave filter device disposed on the piezoelectric substrate and including a plurality of interdigital transducers arranged in a direction in which a surface acoustic wave propagates, and reflectors arranged so as to sandwich the plurality of interdigital transducers therebetween:
a second surface acoustic wave filter device disposed on the piezoelectric substrate and including a plurality of interdigital transducers arranged in a direction in which a surface acoustic wave propagates, and reflectors arranged so as to sandwich the plurality of interdigital transducers therebetween transmission phase characteristics of said second surface acoustic wave filter device being 180° out of phase with transmission phase characteristics of said first surface acoustic wave filter device;
an unbalanced terminal for electrically connecting one terminal of said first surface acoustic wave filter device in parallel to one terminal of said second surface acoustic wave filter device; and
balanced terminals for electrically connecting the other terminal of said first surface acoustic wave filter device to the other terminal of said second surface acoustic wave filter device; wherein
the structure of the reflectors of said first surface acoustic wave filter device is different from the structure of the reflectors of said second surface acoustic wave filter device.

6. A surface acoustic wave filter apparatus according to claim 5, wherein the reflectors of said first surface acoustic wave filter device are different from the reflectors of said second surface acoustic wave filter device in at least one of the number, the pitch, the duty, and the thickness of electrode fingers of the reflectors.

7. A surface acoustic wave filter apparatus according to claim 5, wherein the piezoelectric substrate is a LiTaO₃ piezoelectric substrate.

8. A communication apparatus comprising the surface acoustic wave filter apparatus according to claim 5.

9. A surface acoustic wave filter apparatus comprising:

a piezoelectric substrate;

first, second, and third surface acoustic wave filter devices disposed on the piezoelectric substrate, each of said first, second, and third surface acoustic wave filter devices including a plurality of interdigital transducers arranged in a direction in which a surface acoustic wave propagates, and reflectors arranged so as to sandwich the plurality of interdigital transducers therebetween;

a fourth surface acoustic wave filter device disposed on the piezoelectric substrate and including a plurality of interdigital transducers arranged in a direction in which a surface acoustic wave propagates, and reflectors arranged so as to sandwich the plurality of interdigital transducers therebetween, transmission phase characteristics of said fourth surface acoustic wave filter device being 180° out of phase with transmission phase characteristics of said first, second, and third surface acoustic wave filter devices;

an unbalanced terminal for electrically connecting one terminal of a first group obtained by cascade-connecting said first and second surface acoustic wave filter devices in parallel to one terminal of a second group obtained by cascade-connecting said third and fourth surface acoustic wave filter devices; and balanced terminals for electrically connecting the other terminal of the first group in series to the other terminal of the second group; wherein the structure of the reflectors of at least one of said first through fourth surface acoustic wave filter devices is different from the structure of the reflectors of the other surface acoustic wave filter devices.

10. A surface acoustic wave filter apparatus according to claim 9, wherein the structure of the reflectors of the first group is different from the structure of the reflectors of the second group.

11. A surface acoustic wave filter apparatus according to claim 9, wherein the structures of the reflectors are different among said first through fourth surface acoustic wave filter devices in at least one of the number, the pitch, the duty, and the thickness of electrode fingers of the reflectors.

12. A surface acoustic wave filter apparatus according to claim 9, wherein the piezoelectric substrate is a $LiTaO_3$ piezoelectric substrate.

13. A communication apparatus comprising the surface acoustic wave filter apparatus according to claim 9.

* * * * *